United States Patent
Kim et al.

(10) Patent No.: US 10,356,916 B2
(45) Date of Patent: Jul. 16, 2019

(54) PRINTED CIRCUIT BOARD WITH INNER LAYER AND OUTER LAYERS AND METHOD OF MANUFACTURING THE SAME

(71) Applicant: Samsung Electro-Mechanics Co., Ltd., Suwon-si (KR)

(72) Inventors: Han Kim, Suwon-si (KR); Sang Yul Ha, Suwon-si (KR); Sung Han Kim, Suwon-si (KR); Kyung Ho Lee, Suwon-si (KR); Seok Hwan Ahn, Suwon-si (KR); Myung Sam Kang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 10 days.

(21) Appl. No.: 15/142,484

(22) Filed: Apr. 29, 2016

(65) Prior Publication Data

US 2016/0381791 A1 Dec. 29, 2016

(30) Foreign Application Priority Data

Jun. 29, 2015 (KR) .................. 10-2015-0092258
Sep. 8, 2015 (KR) .................. 10-2015-0127220

(51) Int. Cl.
*H05K 1/02* (2006.01)
*H05K 3/46* (2006.01)
(Continued)

(52) U.S. Cl.
CPC ......... *H05K 3/4688* (2013.01); *H05K 1/0271* (2013.01); *H05K 1/053* (2013.01);
(Continued)

(58) Field of Classification Search
CPC .... H05K 3/4688; H05K 1/0271; H05K 1/053; H05K 1/115; H05K 3/0023; H05K 3/1258
(Continued)

(56) References Cited

U.S. PATENT DOCUMENTS

2008/0078570 A1* 4/2008 Japp .................. H01L 23/145
174/256
2008/0122054 A1* 5/2008 Szewerenko ....... H01L 23/3128
257/679
(Continued)

FOREIGN PATENT DOCUMENTS

JP 2003-318550 A 11/2003
JP 2013-102143 A 5/2013
(Continued)

OTHER PUBLICATIONS

Machine Translation of Japanese Patent Publication No. 2003-318550 (Inventor: Sato et al.), Nov. 7, 2003.*
(Continued)

*Primary Examiner* — Tremesha S Willis
(74) *Attorney, Agent, or Firm* — NSIP Law (57) ABSTRACT

A printed circuit board and a method of manufacturing the same are provided. The printed circuit board includes an inner layer including at least one insulating layer and wiring parts, and outer layers disposed on opposing sides of the inner layer, the outer layers including reinforcing layers and wiring parts, the reinforcing layers having a greater degree of rigidity than the insulating layer.

19 Claims, 7 Drawing Sheets

(51) Int. Cl.
　　*H05K 1/05*　　　(2006.01)
　　*H05K 1/11*　　　(2006.01)
　　*H05K 3/00*　　　(2006.01)
　　*H05K 3/12*　　　(2006.01)

(52) U.S. Cl.
　　CPC ............ *H05K 1/115* (2013.01); *H05K 3/0023* (2013.01); *H05K 3/1258* (2013.01)

(58) Field of Classification Search
　　USPC ........................................................ 174/250
　　See application file for complete search history.

(56) References Cited

U.S. PATENT DOCUMENTS

| | | | |
|---|---|---|---|
| 2011/0042130 A1 | 2/2011 | Lim et al. | |
| 2012/0236507 A1* | 9/2012 | Koyama | G01C 19/5783 361/728 |
| 2014/0104798 A1 | 4/2014 | Park et al. | |
| 2014/0182895 A1* | 7/2014 | Lee | H05K 1/0271 174/251 |
| 2014/0192498 A1* | 7/2014 | Rathburn | H01L 23/49822 361/767 |
| 2015/0136447 A1* | 5/2015 | Katou | H05K 1/0218 174/251 |

FOREIGN PATENT DOCUMENTS

| | | |
|---|---|---|
| KR | 10-2005-0114258 A | 12/2005 |
| KR | 10-1018109 B1 | 2/2011 |
| KR | 10-2014-0048563 A | 4/2014 |

OTHER PUBLICATIONS

Korean Office Action dated Nov. 17, 2016 in counterpart Korean Patent Application No. 10-2015-0127220 (17 pages, with English translation).

* cited by examiner

PRINTED CIRCUIT BOARD WITH INNER LAYER AND OUTER LAYERS AND METHOD OF MANUFACTURING THE SAME

CROSS-REFERENCE TO RELATED APPLICATION

This application claims the benefit under 35 USC 119(a) of Korean Patent Applications No. 10-2015-0092258 and 10-2015-0127220, filed respectively on Jun. 29, 2015 and Sep. 8, 2015, in the Korean Intellectual Property Office, the entire disclosure of both of which are incorporated herein by reference for all purposes.

BACKGROUND

1. Field

The following description relates to a printed circuit board and a method of manufacturing the same.

2. Description of Related Art

Due to the miniaturization of electronic element packages and an increases in the complexity thereof, an improvement of the stability and heat radiation characteristics of printed circuit boards is becoming important. For instance, in a multi-chip package (MCP) in which several semiconductor chips are stacked and mounted on a single board or in a package on package (POP) in which several boards having semiconductor chips mounted thereon are stacked, the printed circuit board for the electronic element package requires improved heat radiation characteristics, stability, reliability, and the like.

Such a printed circuit board may be obtained by stacking a plurality of layers having different physical properties. However, warpage of the printed circuit board may occur due to a difference in physical properties between the plurality of layers. In addition, also in the event that an electronic element, or the like, is embedded in the printed circuit board, warpage of the printed circuit board may occur due to a difference between physical properties of the electronic element and physical properties of a material of the printed circuit board. The physical properties (of the material used for the printed circuit board, such as the modulus of elasticity for example, may be adjusted to cope with the warpage of the printed circuit board. However, in accordance with increasingly thin boards being used in the manufacturing of printed circuit boards, it is expected that, during the manufacturing processes of a printed circuit board, the warpage that may occur unpredictably in the produced printed circuit board may further intensify.

In addition, in accordance with an increase in a demand for the miniaturization of various electronic products containing printed circuit boards, attempts to further narrow the wiring patterns included in printed circuit boards have been continuously undertaken.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes an inner layer including at least one insulating layer and wiring parts, and outer layers disposed on opposing sides of the inner layer, the outer layers including reinforcing layers and wiring parts, the reinforcing layers having a greater degree of rigidity than the insulating layer.

The insulating layer may include a photoimageable dielectric material.

A pitch between wirings of the wiring parts disposed in the inner layer may be smaller than a pitch between wirings of the wiring parts disposed in the outer layer.

The reinforcing layer may include an Fe—Ni alloy.

The outer layers may include insulating parts disposed at least on and beneath the reinforcing layers so as to insulate the reinforcing layers from the wiring parts disposed in the outer layers.

The insulating part of the outer layer may include a material having a greater degree of rigidity than a material of the insulating layer of the inner layer.

The insulating part of the outer layer may include prepreg, and the insulating layer of the inner layer may include a photoimageable dielectric material.

The wiring part of the outer layer may include a conductive via penetrating through the reinforcing layer.

A plurality of insulating layers may be disposed in the inner layer, and the plurality of insulating layers may have a structure in which insulating layers containing materials having different degrees of rigidity are stacked.

A degree of rigidity of a first insulating layer disposed at a center among the plurality of insulating layers may be greater than a degree of rigidity of a second insulating layer disposed peripheral to the first insulating layer among the plurality of insulating layers.

The first insulating layer disposed at the center among the plurality of insulating layers may include prepreg, and the second insulating layer disposed peripheral to the first insulating layer may include a photoimageable dielectric material.

In another general aspect, a method of manufacturing a printed circuit board involves preparing an inner layer including an insulating layer having wiring parts, and disposing outer layers on opposing sides of the inner layer, the outer layers including reinforcing layers having a greater degree of rigidity than those of the insulating layer and wiring parts.

The general aspect of the method may further involve stacking the insulating layer and the outer layers and applying pressure to the insulating layer and the outer layers in directions in which the outer layers are stacked.

The insulating layer and the outer layers may be stacked simultaneously.

The reinforcing layer may include an Fe—Ni alloy.

The outer layers may include insulating parts disposed at least on and beneath the reinforcing layers so as to insulate the reinforcing layers from the wiring parts included in the outer layers.

In another general aspect, a method of manufacturing a printed circuit board involves arranging insulating layers between outer layers, the insulating layers each comprising a layer of an insulating material embedding a wiring part, and the outer layers each including a reinforcing layer, and applying pressure to the arranged insulating layers and outer layers.

The applying of the pressure may cause the insulating layers and the outer layers to be laminated into a stack structure.

The arranging of the insulating layers may involve arranging a plurality of individual insulating layers on top of each other.

Prior to the arranging of the insulating layers, the plurality of individual insulating layers may be obtained by forming a wiring pattern in a photosensitive resin layer without mechanical machining.

The insulating layers may include at least one insulating layer including prepreg and another insulating layer including a photoimageable dielectric material without prepreg.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing illustrative embodiments only and is not intended to be limiting of the present description. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, various embodiments of the present description will be provided with reference to the drawings. In the drawings, for example, due to manufacturing techniques and/or tolerances, modifications of the shape shown may be estimated. Thus, embodiments of the present description should not be construed as being limited to the particular shapes of regions shown herein, for example, and should be considered to include a change in shape results in manufacturing. The following embodiments may also be constituted by one or a combination thereof.

Figure 1:
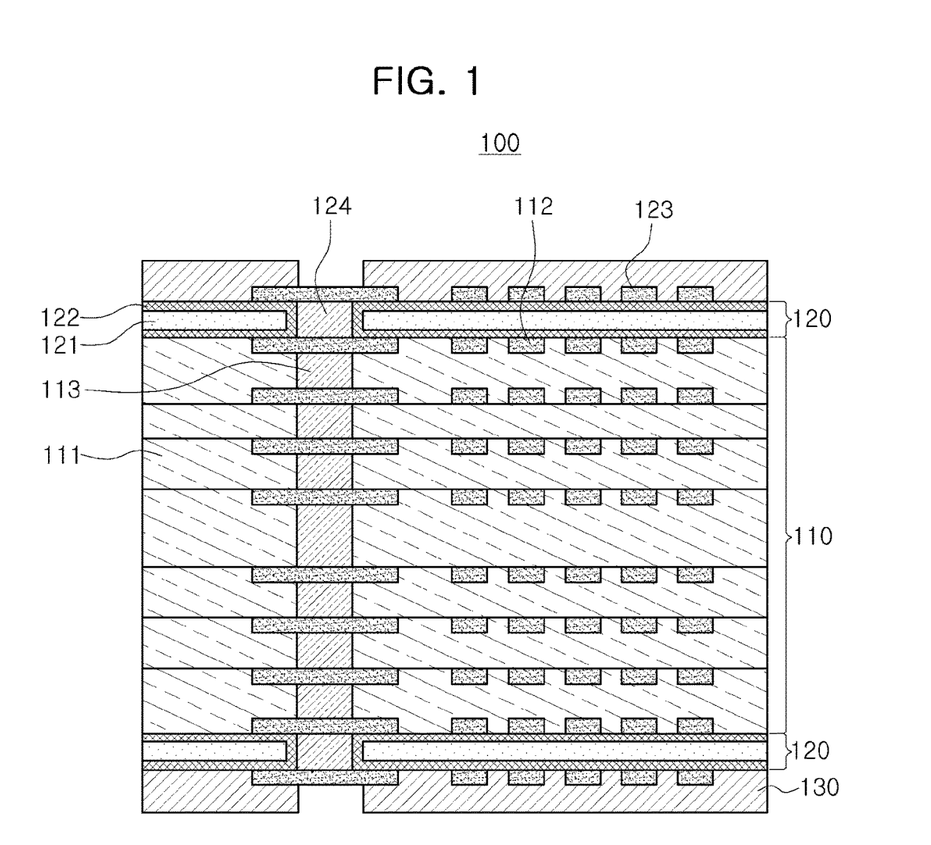
FIG. 1 is a cross-sectional view schematically illustrating an example of a printed circuit board according to the present description.

FIG. 1 is a cross-sectional view schematically illustrating an example of a printed circuit board according to the present description. Referring to FIG. 1, a printed circuit board 100 includes an inner layer 110 and outer layers 120 disposed in the vicinity of the inner layer 110 and provided in order to alleviate warpage. Hereinafter, components of the printed circuit board 100 will be described in detail.

In this example, the inner layer 110 includes insulating layers 111 and wiring parts 112 and 113. Referring to the example illustrated in FIG. 1, a plurality of insulating layers 111 are provided and stacked. However, according to another example, only one insulating layer 111 may be provided as the inner layer 110. In addition, in an example in which the plurality of insulating layers 111 are provided, the plurality of insulating layers 111 may have a structure in which insulating layers containing materials having different degrees of rigidity are stacked as described below.

The insulating layer 111 included in the inner layer 110 may be formed of any material having electrical insulating properties, for example, a photosensitive resin, a thermosetting resin such as epoxy, a thermoplastic resin such as polyimide, a resin having a reinforcing material such as a glass fiber or an inorganic filler impregnated in the thermosetting resin and the thermoplastic resin, for example, prepreg (PPG). In this example, the insulating layer 111 may be formed of a photoimageable dielectric (PID) material. Because a fine pattern may be more easily formed on the insulating layer 111 when a PID material is used rather than a mechanical machining or the like is performed with a non-photoimageable electric material, a high density printed circuit board may be obtained with the use of a PID material. However, the insulating layer 111 formed of a PID material is generally vulnerable to warpage because an amount of filler, such as $SiO_2$, mixed into the insulating material is relatively small. Therefore, the outer layers 120 serving as reinforcements may be disposed on outer surfaces of the inner layer 110 to alleviate warpage.

The wiring parts included in the inner layer 110 may include a wiring pattern 112 and a conductive via 113, which may be formed of a metal such as copper (Cu), nickel (Ni), silver (Ag), or the like, having high electrical conductivity. As described above, in a case in which the inner layer 110 is formed of a material containing the photosensitive resin, the fine pattern may be easily implemented, and a pitch between wirings of the wiring parts 112 and 113 included in the inner layer may be smaller than that of wiring parts, that is, a wiring pattern 123 and a conductive via 124, included in the outer layer 120.

The inventors of the present description have found the fact that, to improve rigidity, a layer having a relatively excellent rigidity may be placed on an outer side of a board rather than in the center of the board. Thus, according to one example, the printed circuit board 100 has the outer layers 120 thereof disposed on the outer surfaces of the inner layer 110 on the basis of this fact. In detail, the outer layers 120 may be disposed, respectively, on first and second main surfaces of the inner layer 110 opposing each other, and may include reinforcing layers 121 and the wiring parts 123 and 124.

The reinforcing layers 121 included in the outer layers 120 may have a greater degree of rigidity than that of the insulating layer 111 of the inner layer 110, and may be disposed on the outermost sides of the printed circuit board 100, as illustrated in FIG. 1. Here, it may be understood that the outermost sides of the printed circuit board 100 are disposed in regions contacting solder resists 130. In this example, the outer layers 120 disposed on the outer surfaces may include the wiring parts, similar to the inner layer 110, and the conductive via 124, among the wiring parts, may penetrate through the reinforcing layer 121. In addition, the printed circuit board 100 may include the solder resists 130 covering the outer layers 120 and exposing at least some of the wiring parts of the outer layers 120.

In order to improve the warpage characteristics described above, the reinforcing layer 121 may contain a material having a greater degree of rigidity than that of, for example, the PID. According to one example, the reinforcing layer 121 is formed of a material containing an Invar alloy, that is, an Fe—Ni alloy also referred to as 64FeNi. Since an Invar alloy, which is an alloy of steel and nickel, is a relatively highly rigid material having a Young's modulus of about 140 GPa with the modulus varying based on a content of Ni, the Invar alloy may be inserted into the printed circuit board, such that an elastic modulus of the printed circuit board may be increased and the rigidity of the printed circuit board may be improved. In this example, as described above, the reinforcing layers 121 are not disposed in the center of the printed circuit board 100, but may be disposed symmetrically to each other at outer sides spaced apart from the center of the printed circuit board 100, thereby significantly increasing improvement of the rigidity of the printed circuit board. However, a material other than the Invar alloy, for example, prepreg, or the like, may also be used as a material of the reinforcing layer 121 as long as it may serve to improve the warpage characteristics described above.

Referring to FIG. 1, the outer layers 120 may include insulating parts 122 disposed at least on and beneath the reinforcing layers 121 so as to insulate the reinforcing layers 121 from the wiring parts 123 and 124. The insulating parts 122 may be used in a case in which the reinforcing layers 121 are formed of a conductive material such as an Invar alloy. The reinforcing layer 121 may be electrically connected to the wiring patterns 112 and 123 disposed thereon or therebeneath, as desirable. To this end, a conductive via penetrating through the insulating part 122 may be provided.

In addition, the insulating part 122 may also be used in order to improve the warpage characteristics even in the event that the reinforcing layer 121 is not formed of a conductive material. In order to further improve rigidity, the insulating part 122 configuring the outer layer 120 may be formed of a material having a greater degree of rigidity than that of the insulating layer 111 of the inner layer 110. For example, provided that the insulating layer 111 of the inner layer 110 is formed of PID, the insulating part 122 of the outer layer 120 may be formed of prepreg, epoxy, or the like.

Figure 2:
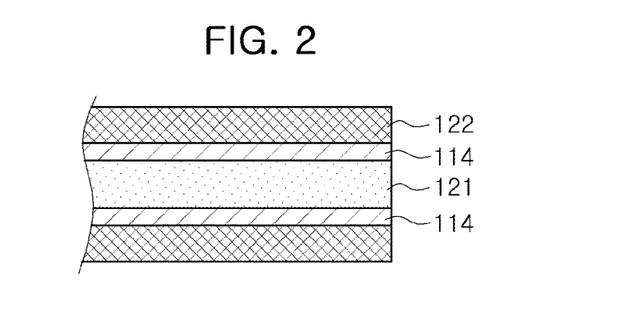
FIG. 2 is a cross-sectional view schematically illustrating an example of an outer layer according to a modified example of the printed circuit board illustrated in FIG. 1.

In addition, as in a modified example illustrated in FIG. 2, an adhesion layer 114 may be interposed between the reinforcing layer 121 and the insulating part 122 in order to improve coupling force between interfaces. The adhesion layer 114 may be formed of a material having excellent adhesion and good electrical conductive and heat radiation performance, such as copper, or the like. In the event that the adhesion layer 114 is formed of a conductive material such as copper, or the like, the adhesion layer 114 may be electrically connected to the wiring patterns 112 and 123 disposed thereon or therebeneath, as desirable. To this end, a conductive via penetrating through the insulating part 122 may be provided. The modified example illustrated in FIG. 2 may also be applied to the following additional embodiments.

Figure 3:
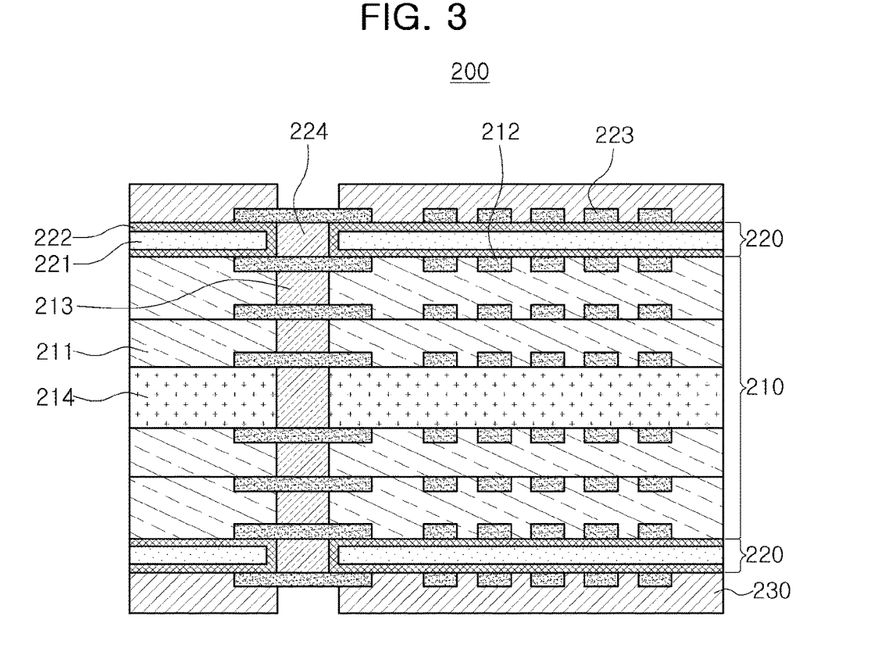
FIGS. 3 through 5 are, respectively, cross-sectional views schematically illustrating additional examples of printed circuit boards.
Figure 4:
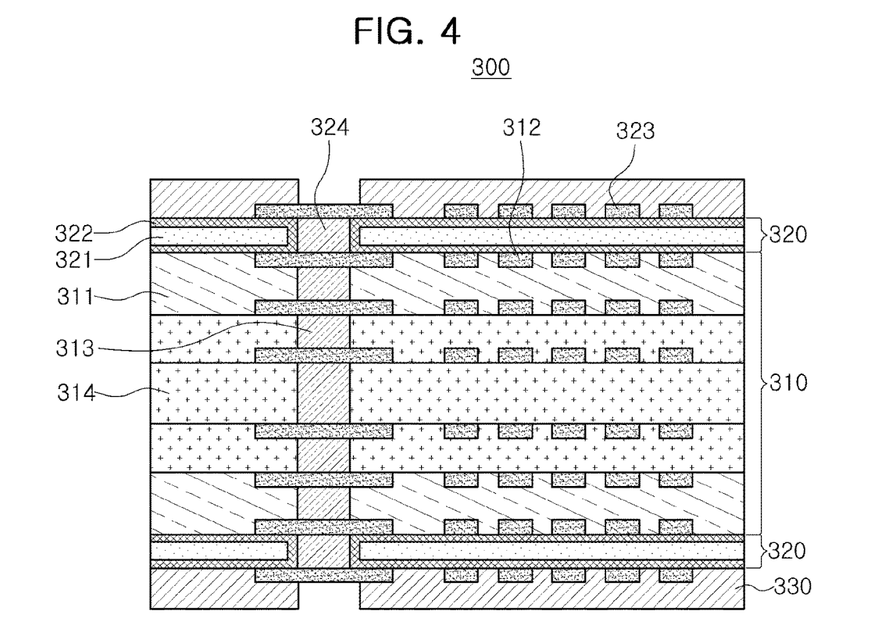
Figure 5:
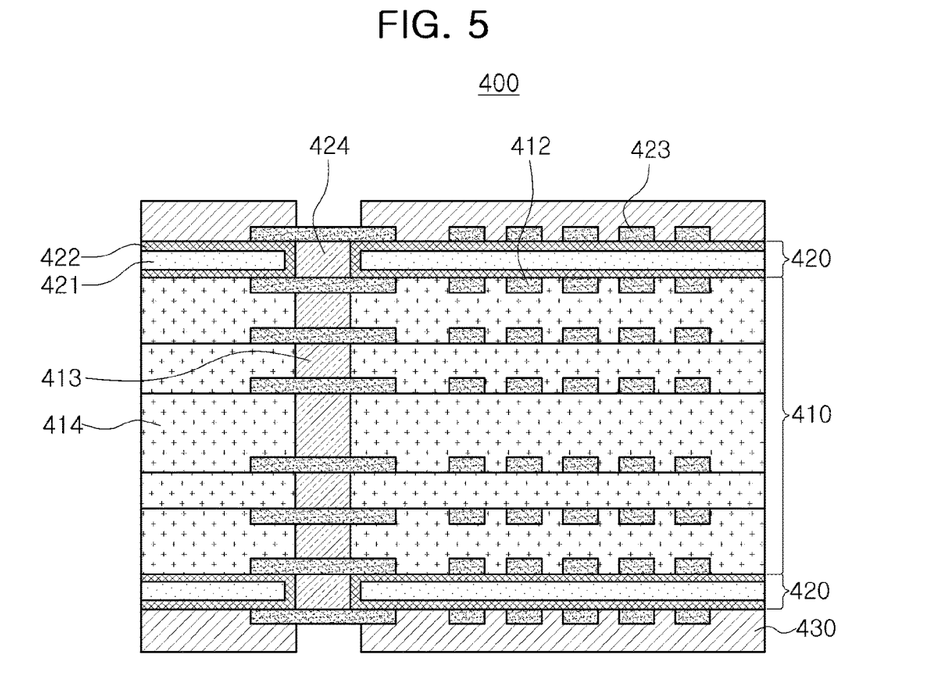
Figure 6A:
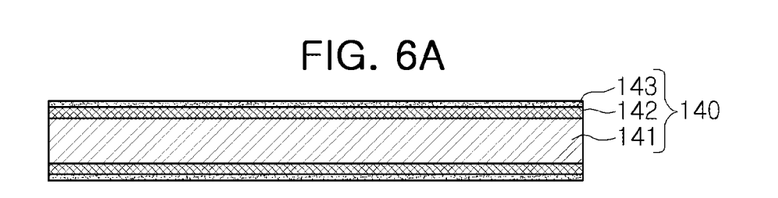
FIGS. 6A, 6B, 7A, 7B, 8A, 8B, 9 and 10 are views schematically illustrating an example of a method of manufacturing a printed circuit board.
Figure 6B:
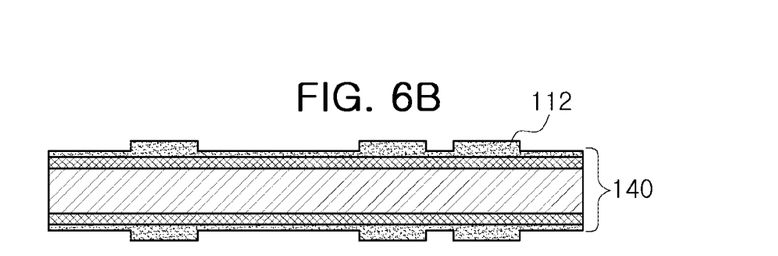

FIGS. 3 through 5 are, respectively, cross-sectional views schematically illustrating additional embodiments of printed circuit boards. The examples of printed circuit boards illustrated in FIGS. 3 through 5 may be different in a material forming an inner layer from the example of the printed circuit board illustrated in FIG. 1.

The example of printed circuit board 200 illustrated in FIG. 3 includes an inner layer 210 and outer layers 220 provided in the vicinity of the inner layer 210 in order to improve the rigidity of the printed circuit board 200. Referring to FIG. 3, the inner layer 210 includes a plurality of insulating layers 211 and 214 and wiring parts 212 and 213. The plurality of insulating layers 211 and 214 may have a structure in which insulating layers containing materials having different degrees of rigidity are stacked. For example, an insulating layer 214 disposed in the center among the plurality of insulating layers may have a greater degree of rigidity than that of an insulating layer 211 disposed at an outer side among the plurality of insulating layers. For example, the insulating layer 214 disposed in the center among the plurality of insulating layers may contain prepreg to further improve rigidity of the printed circuit board, and may be provided in a form of a copper clad laminate (CCL) in a process of manufacturing the printed circuit board. In addition, the insulating layer 211 disposed at the outer side among the plurality of insulating layers may contain a PID, thereby providing a structure appropriate for implementing a fine pattern.

The outer layers 220 may be disposed, respectively, on first and second main surfaces of the inner layer 210 opposing each other, and may include reinforcing layers 221 formed of an Invar alloy, or the like, and wiring parts 223 and 224. The outer layers 220 may include insulating parts 222 disposed at least on and beneath the reinforcing layers 221 so as to insulate the reinforcing layers 221 from the wiring parts 223 and 224. In addition, solder resists 230 covering the outer layers 220 may be formed.

An example of a printed circuit board 300 illustrated in FIG. 4 includes an inner layer 310 and outer layers 320 provided in the vicinity of the inner layer 310 in order to improve the rigidity of the printed circuit board 300. In this example, the inner layer 310 includes a plurality of insulating layers 311 and 314 and wiring parts 312 and 313. The insulating layers 311 and 314 have a structure in which a plurality of insulating layers containing materials having different degrees of rigidity are stacked. For example, insulating layers 314 disposed in the center among the plurality of insulating layers may have a greater degree of rigidity than that of an insulating layer 311 disposed at an outer side among the plurality of insulating layers. For example, the number of insulating layers 314 disposed in the center among the plurality of insulating layers may be three, and the insulating layers 314 disposed in the center may contain prepreg to further improve rigidity of the printed circuit board. In this case, the three insulating layers 314 having an excellent rigidity and disposed in the center may be obtained by stacking prepreg on a CCL in both directions in a process of manufacturing the printed circuit board. Further, similar to the example described above, the insulating layer 311 disposed at the outer side among the plurality of insulating layers may contain PID, thereby providing a structure appropriate for implementing a fine pattern.

The outer layers 320 may be disposed, respectively, on first and second main surfaces of the inner layer 310 opposing each other, and may include reinforcing layers 321 formed of an Invar alloy, or the like, and wiring parts 323 and 324, as in the example described above. The outer layers 320 may include insulating parts 322 disposed at least on and beneath the reinforcing layers 321 so as to insulate the reinforcing layers 321 from the wiring parts 323 and 324. In addition, solder resists 330 covering the outer layers 320 may be formed.

Referring to FIG. 5, an example of a printed circuit board 400 includes an inner layer 410 and outer layers 420 provided in the vicinity of the inner layer 410 in order to improve the rigidity of the printed circuit board 400. In this example, the inner layer 410 includes a plurality of insulating layers 414 and wiring parts 412 and 413. The plurality of insulating layers 414 may contain a highly rigid material such as prepreg to further improve the rigidity of the printed circuit board 400. The plurality of insulating layers 414 may be obtained by stacking prepreg on a CCL in both directions in a process of manufacturing the printed circuit board. Unlike the example described above, in the present example, the inner layer 410 may be formed of only a highly rigid material such as prepreg instead of a PID, and may be used in a case in which a high degree of rigidity rather than a fine pattern is required.

The outer layers 420 may be disposed, respectively, on first and second main surfaces of the inner layer 410 opposing each other, and may include reinforcing layers 421 formed of an Invar alloy, or the like, and wiring parts 423 and 424, as in the example described above. The outer layers 420 may include insulating parts 422 disposed at least on and beneath the reinforcing layers 421 so as to insulate the reinforcing layers 421 from the wiring parts 423 and 424. In addition, solder resists 430 covering the outer layers 420 may be formed.

Hereinafter, a method of efficiently manufacturing the printed circuit board described above will be described, and the components described above will be understood in more detail through the following description for a method of manufacturing the printed circuit board. FIGS. 6A, 6B, 7A, 7B, 8A, 8B, 9 and 10 are views schematically illustrating an example of a method of manufacturing a printed circuit board.

First, an example of a method of manufacturing a printed circuit board may basically include preparing the inner layer including the insulating layer having the wiring parts, and disposing the outer layers, respectively, on the first and second main surfaces of the inner layer opposing each other, the outer layers including the reinforcing layers having a greater degree of rigidity than that of the insulating layer and the wiring parts.

An example of the process of manufacturing a printed circuit board described above will be described with reference to FIGS. 6A, 6B, 7A, 7B, 8A, 8B, 9 and 10. First, referring to FIG. 6B, a wiring pattern 112 is formed on a carrier 140 illustrated in FIG. 6A. The carrier 140 may be provided in order to handle a single insulating layer, and may include a base 141, releasing agents 142, and seed layers 143. In this case, a configuration of the carrier 140 may be appropriately modified, as desirable. For example, the carrier 140 may also have a form in which the releasing agents 142 and the seed layers 143 are excluded. The wiring pattern 112 may be obtained by plating a material such as copper, or the like, using the seed layers 143 as seeds.

Figure 7A:
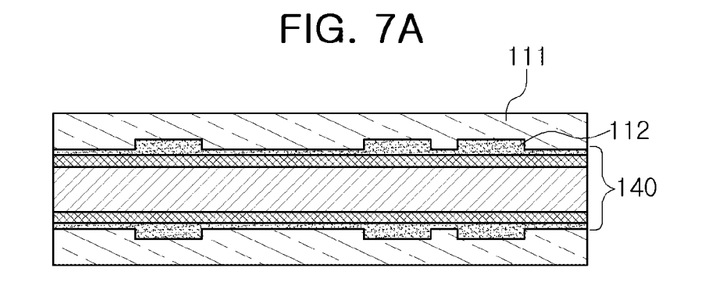
Figure 7B:
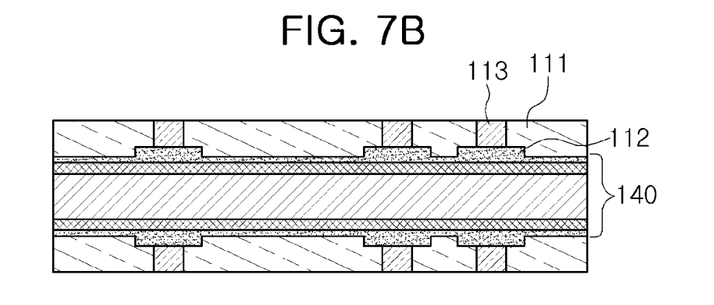

Next, referring to FIGS. 7A and 7B, the insulating layers 111 may be formed to be coupled to the carrier 140, and the conductive vias 113 among the wiring parts may be formed. In this example, the insulating layers 111 is formed on and beneath the carrier 140, thereby improving process efficiency. The insulating layers 111 may contain PID as described above. The insulating layers 111 may be prepared in advance and then bonded to the carrier 140 or may be directly formed on the carrier 140 by a process such as a deposition process, or the like. In the event that the insulating layer 111 contains the PID, the wiring part such as the conductive via 113 may be formed as a fine pattern without using a mechanical machining process.

Figure 8A:
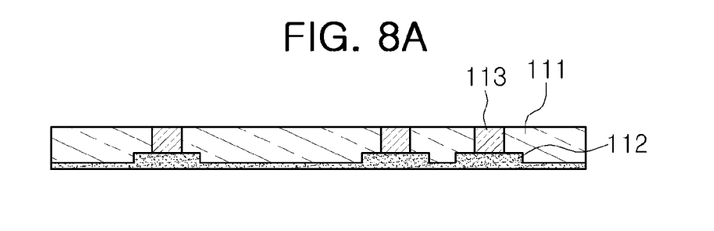
Figure 8B:
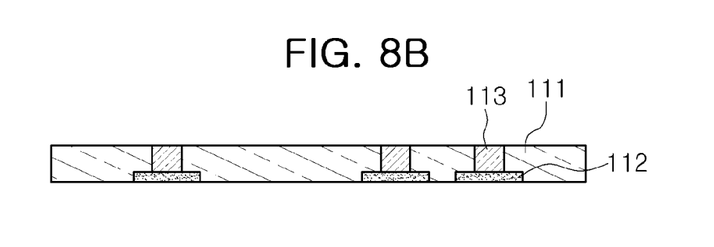

After the insulating layers 111 are formed, the carrier 140 is separated or removed from the insulating layers 111, as illustrated in FIG. 8A. In this example, two unit insulating layers 111 including the wiring parts 112 and 113 may be obtained from a single carrier 140, as illustrated in FIG. 8B. In this example, the remaining seed layers 143 may be removed through etching as desirable.

Figure 9:
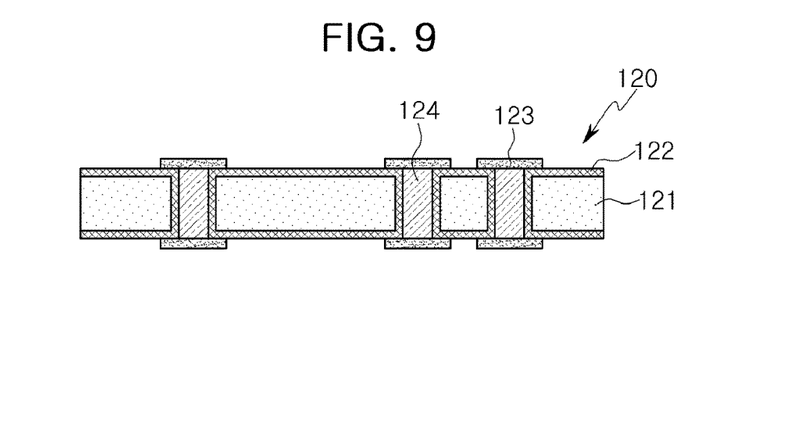

Apart from the insulating layers 111, the outer layer 120 may be manufactured as illustrated in FIG. 9. In this example, the outer layer 120 includes the reinforcing layer 121 and the wiring parts 123 and 124, as in an embodiment described above. In this example, the reinforcing layer 121 may be formed of the Invar alloy, a form in which the insulating part 122 is formed so as to separate the reinforcing layer 121 from the wiring parts 123 and 124 will be described, and the insulating part 122 may be formed of the prepreg in order to improve rigidity. The insulating part 122 may be formed of a material such as an epoxy resin, or the like, in addition to the prepreg. As an example of forming the outer layer 120, the reinforcing layer 121 and the insulating part 122 may be independently prepared and then stacked, and the wiring parts 123 and 124 may be formed using appropriate machining and pattern forming processes.

Figure 10:
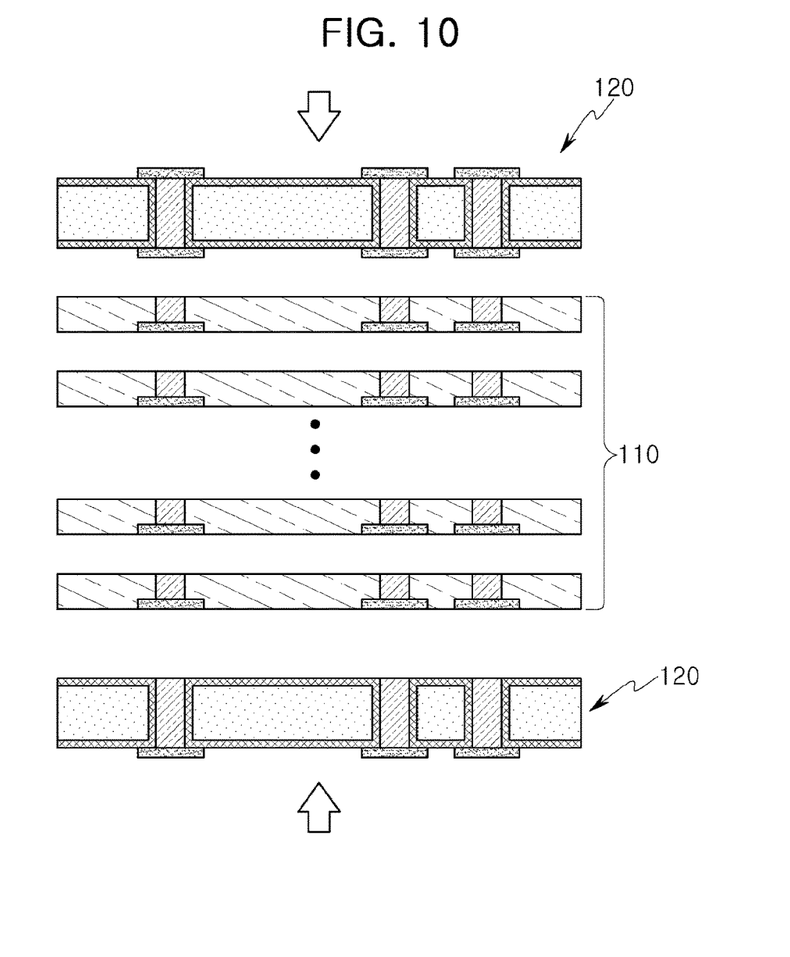

After the insulating layer 111 and the outer layer 120 are prepared, the inner layer 110 including the insulating layer and the outer layers 120 may be stacked in a manner desirable, and pressure may be applied to the inner layers 110 and outer layers 120 in directions in which the outer layers 120 are stacked, that is, from the top and the bottom, as illustrated in FIG. 10, thereby obtaining a stack structure of the printed circuit board. In this case, an appropriate number of insulating layers may be included in the inner layer 110, and the inner layer 110 and the outer layers 120 may be stacked simultaneously. Then, the solder resists 130 may be formed at the outermost side of the printed circuit board to obtain the printed circuit board described in the example described above. The solder resist 130, which has a shape appropriate for being used in an integrated circuit (IC) package board, or the like, may have an appropriate shape depending on a design or a required function.

Figure 11:
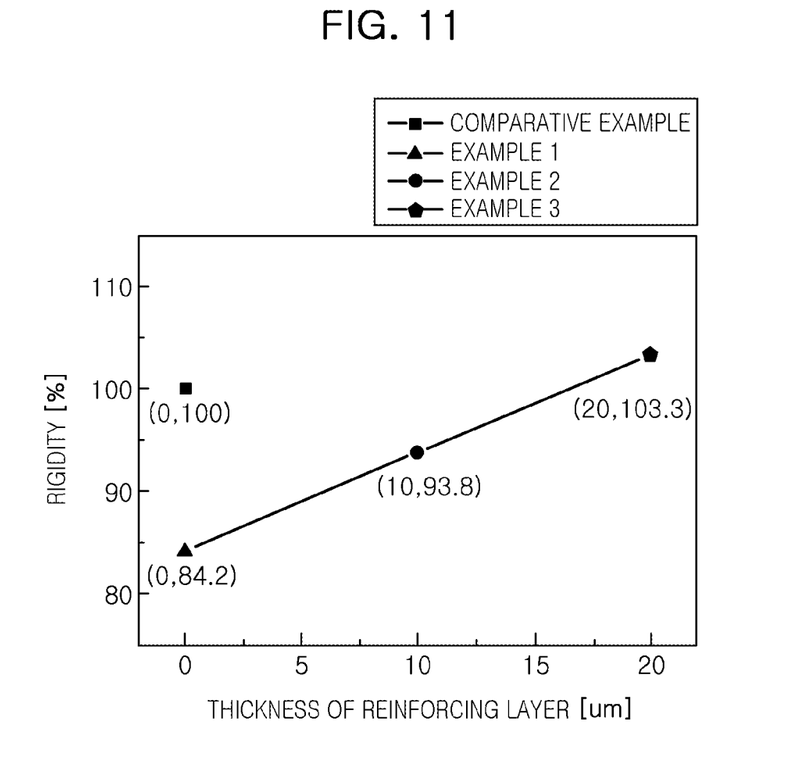
FIG. 11 is a graph illustrating warpage characteristics of printed circuit boards according to Examples 1-3 and Comparative Example.

Meanwhile, the inventors of the present disclosure have performed a simulation in order to find out warpage characteristics of a reinforcing structure by the outer layers suggested in the present disclosure. FIG. 11 is a graph illustrating warpage characteristics of printed circuit boards according to Examples 1-3 and Comparative Example described below. Materials forming components of Comparative Example and Examples 1-3 are as follows, and an inner layer and an outer layer were implemented at a similar thickness.

COMPARATIVE EXAMPLE

Board in which both of an inner layer and an outer layer are formed of prepreg

Example 1

Board in which an inner layer is formed of PID (containing 40 wt % of $SiO_2$) and an outer layer is formed of prepreg (40 μm)

Example 2

Board in which an inner layer is formed of PID (containing 40 wt % of $SiO_2$) and an outer layer has an Invar alloy (10 μm) inserted between prepregs (corresponding to insulating parts in the description described above)

Example 3

Board in which an inner layer is formed of PID (containing 40 wt % of $SiO_2$) and an outer layer has an Invar alloy (20 μm) inserted between prepregs (corresponding to insulating parts in the description described above)

As can be seen in a simulation result of FIG. 11, a structure in which the inner layer is formed of the PID was accompanied by a reduction in rigidity, which may be supplemented by the reinforcing layer disposed at the outer side. For instance, a more excellent degree of rigidity could be obtained in a case of using the Invar alloy having an appropriate thickness as a material of the reinforcing layer together with the prepreg than in a case of using only the prepreg (Comparative Example).

As set forth above, according to an example according to the present disclosure, the outer layers having a relatively excellent rigidity may be disposed on the outer surfaces of the inner layer to improve warpage performance, and the fine pattern may be implemented in the inner layer to obtain a high density printed circuit board. In addition, according to an example according to the present disclosure, a method of efficiently manufacturing the printed circuit board having the structure described above may be provided. The high density printed circuit board may have a high degree of rigidity through improvement of warpage characteristics and may include a fine wiring structure.

The printed circuit board according to one example may include an inner layer including at least one insulating layer and wiring parts, and outer layers disposed, respectively, on first and second main surfaces of the inner layer opposing each other and including reinforcing layers having a greater degree of rigidity than those of the insulating layer and wiring parts.

According to an example, a method of efficiently manufacturing the printed circuit board involves stacking the inner layer and the reinforcing layers simultaneously and applying pressure to obtain a printed circuit board.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
an inner layer comprising an insulating layer and wiring parts; and
outer layers disposed symmetrically to each other on opposing sides of the inner layer, wherein the outer layers comprise:
reinforcing layers and wiring parts, the reinforcing layers having a higher rigidity than the insulating layer, and
insulation parts disposed at opposing surfaces of each of the reinforcing layers, and disposed between a conductive via and a first side surface of a reinforcing layer, among the reinforcing layer,
wherein a second side surface of a reinforcing layer, among the reinforcing layers, is exposed at an edge of the printed circuit board.

2. The printed circuit board of claim 1, wherein a pitch between wirings of the wiring parts disposed in the inner layer is smaller than a pitch between wirings of the wiring parts disposed in the outer layers.

3. The printed circuit board of claim 1, wherein the outer layers comprise the insulating parts disposed on and beneath the reinforcing layers to insulate the reinforcing layers from the wiring parts disposed in the outer layers.

4. The printed circuit board of claim 3, wherein the insulating parts of the outer layers comprise a material having a higher rigidity than a material of the insulating layer of the inner layer.

5. The printed circuit board of claim 4, wherein the insulating parts of the outer layers comprise prepreg.

6. The printed circuit board of claim 1, wherein the wiring parts of the outer layers comprise a conductive via penetrating through the reinforcing layers.

7. The printed circuit board of claim 1, wherein insulating layers are disposed in the inner layer, and the insulating layers have a structure in which insulating layers comprising materials having different degrees of rigidity are stacked.

8. The printed circuit board of claim 7, wherein a rigidity of a first insulating layer disposed at a center among the insulating layers is higher than a rigidity of a second insulating layer disposed peripheral to the first insulating layer among the insulating layers.

9. The printed circuit board of claim 8, wherein the first insulating layer disposed at the center among the insulating layers comprises prepreg, and the second insulating layer disposed peripheral to the first insulating layer comprises a photoimageable dielectric material.

10. A method of manufacturing a printed circuit board, the method comprising:
preparing an inner layer comprising an insulating layer having wiring parts; and
disposing outer layers on opposing sides of the inner layer, wherein the outer layers comprise:
reinforcing layers having a higher rigidity than the insulating layer and disposed symmetrically to each other on opposing sides of the inner layer, and
insulation parts disposed at opposing surfaces of each of the reinforcing layers and between a conductive via and a first side surface of a reinforcing layer, among the reinforcing layer,
wherein a second side surface of a reinforcing layer, among the reinforcing layers, is exposed at an edge of the printed circuit board.

11. The method of claim 10, further comprising stacking the insulating layer and the outer layers and applying pressure to the insulating layer and the outer layers in directions in which the outer layers are stacked.

12. The method of claim 11, wherein the insulating layer and the outer layers are stacked simultaneously.

13. The method of claim 11, wherein the outer layers comprise the insulating parts disposed on and beneath the reinforcing layers to insulate the reinforcing layers from the wiring parts included in the outer layers.

14. A method of manufacturing a printed circuit board, comprising:
arranging insulating layers between outer layers, the insulating layers each comprising a layer of an insulating material embedding a wiring part, and the outer layers each comprising a reinforcing layer being disposed between insulation parts at opposing surfaces of the reinforcing layer, wherein an insulation part, among the insulation parts is disposed between a conductive via and a first side surface of a reinforcing layer, among the reinforcing layers, and wherein a second side surface of a reinforcing layer, among the reinforcing layers, is exposed at an edge of the printed circuit board; and
applying pressure to laminate the arranged insulating layers and outer layers into a stack structure.

15. The method of claim 14, wherein the arranging of the insulating layers comprises arranging individually-formed insulating layers on top of each other.

16. The method of claim 14, wherein, prior to the arranging of the insulating layers, the insulating layers are each obtained by forming a wiring pattern in a photosensitive resin layer without mechanical machining.

17. The method of claim 14, wherein the insulating layers comprise an insulating layer comprising prepreg and another insulating layer comprising a photoimageable dielectric material without prepreg.

18. The printed circuit board of claim 1, wherein the reinforcing layers comprise an Fe—Ni alloy.

19. The printed circuit board of claim 1, wherein the reinforcing layers are formed of a material having a Young's modulus of about 140 GPa.

* * * * *